United States Patent [19]
Kotani et al.

[11] Patent Number: 5,369,862
[45] Date of Patent: Dec. 6, 1994

[54] METHOD OF PRODUCING A PIEZOELECTRIC DEVICE

[75] Inventors: Kenichi Kotani; Mikio Nakajima; Yukio Yoshino; Toru Kasanami; Akio Ikeda, all of Kyoto, Japan

[73] Assignee: Murata Manufacturing Co., Ltd., Kyoto, Japan

[21] Appl. No.: 809,047

[22] Filed: Dec. 16, 1991

Related U.S. Application Data

[62] Division of Ser. No. 661,074, Feb. 26, 1991, abandoned.

[30] Foreign Application Priority Data

Feb. 26, 1990 [JP] Japan ................................ 2-46872
May 30, 1990 [JP] Japan ............................... 2-142101
Jan. 25, 1991 [JP] Japan ................................ 3-007400

[51] Int. Cl.$^5$ ............................................. H04R 17/00
[52] U.S. Cl. ................................... 29/25.35; 29/25.42
[58] Field of Search .................. 29/25, 35, 42, 620; 310/312, 320–324, 340, 344, 348

[56] References Cited

U.S. PATENT DOCUMENTS

| | | | |
|---|---|---|---|
| 3,766,616 | 10/1973 | Staudte | 310/312 X |
| 3,768,157 | 10/1973 | Buie | 29/620 |
| 3,969,640 | 7/1976 | Staudte | 310/340 X |
| 4,080,696 | 3/1978 | Shimatsu | 29/25.35 |
| 4,435,441 | 3/1984 | Mariani et al. | 427/100 X |
| 4,464,599 | 8/1984 | Briese | 310/348 |
| 4,496,247 | 1/1985 | Kumada | 310/363 X |
| 4,510,410 | 4/1985 | Yuhara et al. | 310/313 D |
| 4,562,370 | 12/1985 | Dach | 310/312 |
| 4,612,471 | 9/1986 | Nakamura et al. | 310/321 |
| 4,649,310 | 3/1987 | Nakamura et al. | 310/312 X |
| 4,652,787 | 3/1987 | Zingg | 310/344 |
| 4,703,557 | 11/1987 | Nespor et al. | 29/620 |
| 4,844,577 | 7/1989 | Ninnis et al. | 310/332 U X |
| 5,032,755 | 7/1991 | Witte | 310/312 |

FOREIGN PATENT DOCUMENTS 61-123211 6/1986 Japan .

*Primary Examiner*—P. W. Echols
*Attorney, Agent, or Firm*—Heller, Ehrman, White & McAuliffe

[57] ABSTRACT

A piezoelectric device is essentially composed of a piezoelectric transducer and a light transmitting protector. The protector is made of heat resisting glass, heat resisting acrylic, transparent ceramics or the like. By exposing the piezoelectric device to a laser beam and thereby causing it to penetrate through the protector to the piezoelectric transducer and to partly cut the surface of the piezoelectric transducer, or to change the intensity of polarization, mechanical coupling coefficient or dielectric constant of the piezoelectric transducer, its vibration frequency and resonance characteristic can be adjusted. If an ultraviolet-ray setting agent is used as adhesive, it can be hardened by exposing the piezoelectric device to ultraviolet rays to thereby cause it penetrate through the protector.

17 Claims, 7 Drawing Sheets

METHOD OF PRODUCING A PIEZOELECTRIC DEVICE

This is a divisional of application Ser. No. filed Feb. 26, 1991, now abandoned

BACKGROUND OF THE INVENTION

1. Field of the Invention

The present invention relates to a method of producing a piezoelectric device adapted to be installed in an oscillation circuit, a filter circuit or the like.

2. Description of Related Art

Conventional piezoelectric devices are categorized into two types, depending on the way they are structured. One type is wherein a piezoelectric transducer is placed between protection boards so as to have a space for vibration. The other type is wherein a piezoelectric transducer is shielded in a protection case so as to have a space for vibration. Generally, a crystal plate, a ceramic plate or a metal plate having a piezoelectric layer thereon is used as the piezoelectric transducer. The protection boards and the protection case are made of resin, metal, ceramics or the like.

The vibration frequency and resonance characteristic of such a conventional piezoelectric device cannot be adjusted after the piezoelectric transducer is encased in the protection case or the protection boards. If the vibration frequency is found to be incorrect in a product checking process, it is too late to make a correction.

The piezoelectric transducer is usually connected with the protection boards or the protection case by adhesive. In the case of a device with the transducer encased in a protection case, an electrode extended from a vibrating electrode of the piezoelectric transducer may be joined to a conductor disposed on an inner wall of the protection case by conductive adhesive. Generally, thermosetting resin like epoxy resin is used as the adhesive. In order to harden such resin, the piezoelectric device must be processed under a high temperature (about 150° C.). If temperature control in this process is not carried out carefully, the polarization of the piezoelectric transducer will be impaired by heat, thereby failing to provide a designed electric characteristic.

SUMMARY OF THE INVENTION

A major object of the present invention is to provide a method of producing a piezoelectric device of which vibration frequency and resonance characteristic can be adjusted even after its piezoelectric transducer is encased.

Another object of the present invention is to provide a method of producing a piezoelectric device which is not affected by heat generated in a process of joining a piezoelectric transducer to protection boards or a protection case, or in a process of joining an electrode extended from a vibrating electrode of the piezoelectric transducer to a conductor provided in the protection case on its inner wall.

In order to attain the objects above, a piezoelectric device according to the present invention comprises a piezoelectric transducer and a protector made of a light transmitting material for protecting the piezoelectric transducer.

In order to adjust the vibration frequency and resonance characteristic of the piezoelectric device after the piezoelectric transducer is encased in the protector, the piezoelectric device is exposed to a laser beam. The laser beam penetrates through the protector to the piezoelectric transducer and cuts the surface of the piezoelectric transducer partly, thereby adjusting the vibration frequency and resonance characteristic of the piezoelectric device. For example, consider a piezoelectric device of which the piezoelectric transducer has a mechanical vibrating portion comprising an elastic metal plate having a piezoelectric layer on one side and an electrode on the piezoelectric layer. Suppose now that this device is exposed to a laser beam such that the laser beam irradiates the side of the mechanical vibrating portion on which the electrode is not formed but cuts the surface of the mechanical vibrating portion partly. In this process, the vibration frequency or resonance characteristic of the piezoelectric transducer, or both, can be changed, depending on which part of the mechanical vibrating portion is cut.

If the piezoelectric transducer has not only a vibrating electrode but also a pair of capacitance electrodes for providing capacitance, the laser beam also changes the dielectric constant of the capacitance electrodes, whereby the capacitance of the piezoelectric device as well as the resonance frequency and passing band width can be adjusted.

The resonance frequency and passing band width of the piezoelectric device can be adjusted also by changing the intensity of polarization, electromechanical coupling coefficient or dielectric constant of the piezoelectric transducer with a laser beam.

A piezoelectric device according to the present invention is assembled by joining a piezoelectric transducer and protection boards into a laminate by an ultraviolet-ray setting agent. Alternatively, a piezoelectric transducer is set in a protection case which consists of a body and a lid, and the lid is joined to the body by an ultraviolet-ray setting agent. If such a piezoelectric device is exposed to ultraviolet rays, causing them to penetrate the protection boards or the protection case, the ultraviolet-ray setting agent hardens, and the piezoelectric transducer and the protection boards, or the lid and the body are firmly stuck together. This joining process does not generate heat which deteriorates the piezoelectric transducer.

According to the present invention, an ultraviolet-ray setting agent may also be used for connecting an electrode extended from the vibrating electrode of the piezoelectric transducer to a conductor provided in the protection case on the inner wall. If the piezoelectric device is exposed to ultraviolet rays and the rays penetrate through the protection case, the ultraviolet-ray setting agent hardens, thereby joining together the extension electrode of the vibrating electrode and the conductor. Thus, it is less likely that the piezoelectric transducer be deteriorated by heat during a process of joining the extension electrode and the conductor.

BRIEF DESCRIPTION OF THE DRAWINGS

These and other objects and features of the present invention will become apparent from the following description with reference to the accompanying drawings, in which.

DETAILED DESCRIPTION OF THE PREFERRED EMBODIMENT

Next, piezoelectric devices according to the present invention and methods of producing such piezoelectric devices will be explained with reference to the accompanying drawings which are intended to show not only their features but also the principles of the present invention.

FIRST EMBODIMENT (See FIGS. 1-5)

Figure 1:
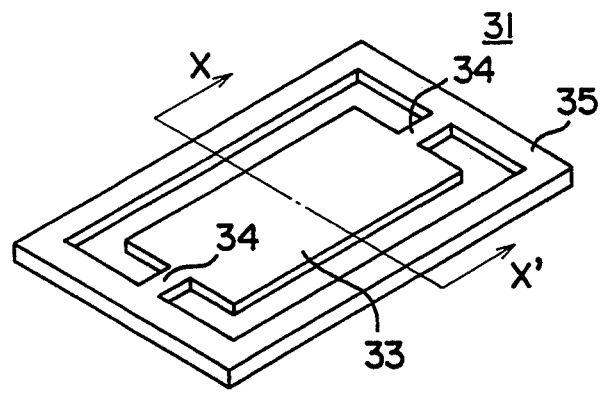
FIG. 1 is a perspective view of a piezoelectric vibrating plate which is a component of a piezoelectric device according to a first embodiment of the present invention.
Figure 2:
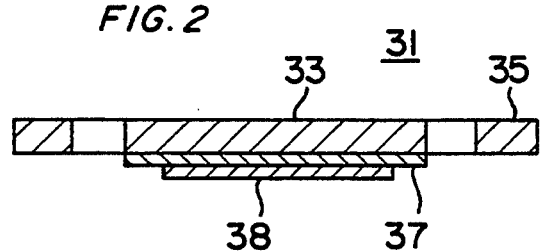
FIG. 2 is a vertical sectional view of the piezoelectric vibrating plate taken along the line X—X' indicated in FIG. 1.

FIGS. 1 and 2 illustrate a piezoelectric transducer 31 which is a metal transducer having a piezoelectric layer. The piezoelectric transducer 31 consists of a generally rectangular mechanical vibrating portion 33 having a shorter side and a longer side, a connecting portion 34 and a frame 35. The piezoelectric transducer 31 is made of an elastic metal, such as elinvar, whose elasticity is constant under ordinary temperatures. The piezoelectric layer 37 is made, for example, of zinc oxide, and is disposed on one side of the mechanical vibrating portion 33. Additionally, an electrode 38 is formed on the piezoelectric layer 37. When the electrode 38 and the frame 35 are impressed with a voltage, the vibrating portion 33 vibrates. This piezoelectric transducer 31 vibrates in a stretch vibration mode, and the vibration frequency is determined by the length of the shorter side of the vibrating portion 33. After having its vibration frequency, resonance characteristic, etc. tentatively set during its production, the piezoelectric transducer 31 is subjected to a next process.

Figure 3:
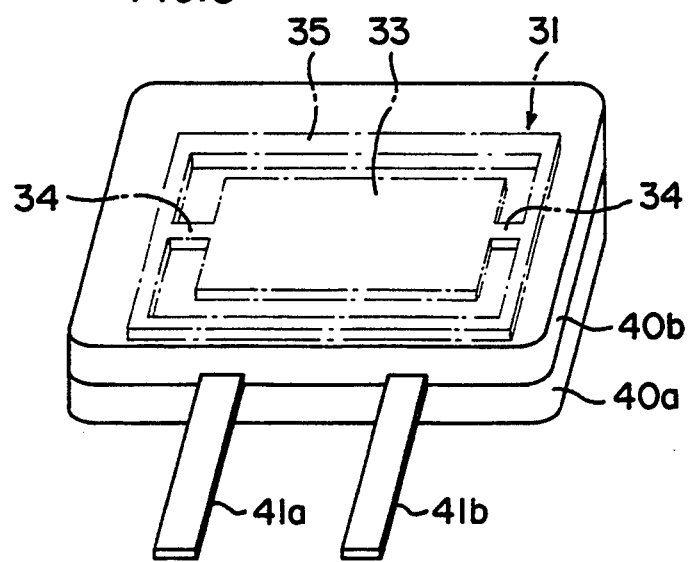
FIG. 3 is a perspective view of the piezoelectric vibrating plate shown in FIG. 1 after it is encased.

As shown in FIG. 3, the piezoelectric transducer 31 is completely surrounded by protectors 40a and 40b having a space in between so as to enable the piezoelectric transducer 31 to vibrate such that the vibrating portion 33 is within this space. The protectors 40a and 40b are made of a light transmitting material such as heat resisting glass, heat resisting acrylic, or transparent ceramics. However, one of the protectors 40a and 40b may not be light transmitting.

Lead terminals 41a and 41b are provided so as to protrude from the protectors 40a and 40b so that a voltage can be applied between the electrode 38 and the frame 35 therethrough.

Figure 4:
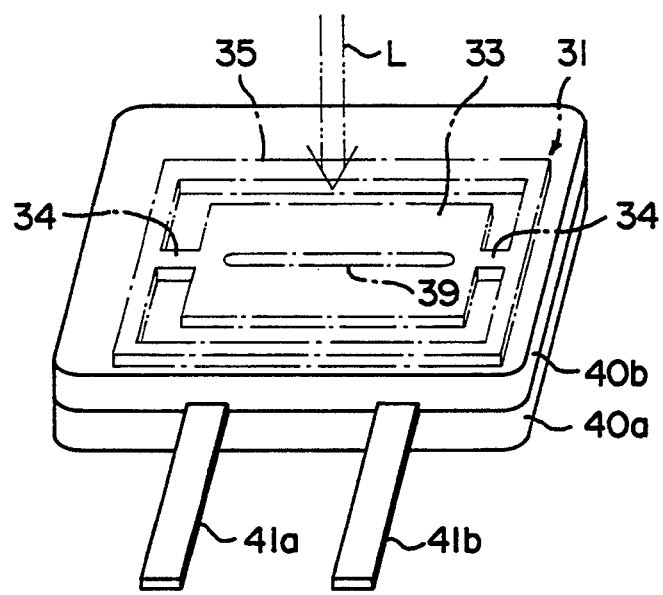
FIG. 4 is a perspective view of the encased piezoelectric vibrating plate showing a process of cutting the surface of the piezoelectric vibrating plate partly with a laser beam.
Figure 5:
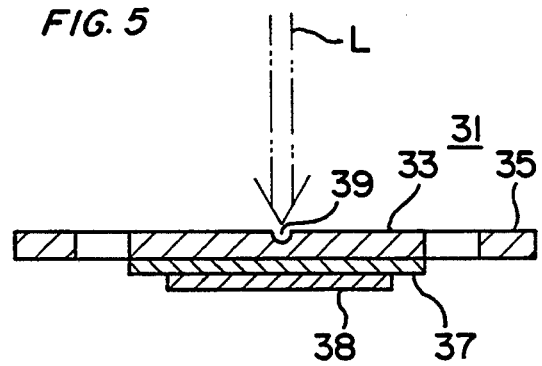
FIG. 5 is a vertical sectional view of the piezoelectric device shown in FIG. 4.

The piezoelectric device thus assembled is subjected to a product checking process, wherein its vibration frequency, resonance characteristic, etc. are measured. If the results of such measurements are not within an allowable range, the product will be subjected to an adjusting process wherein it is exposed to a laser beam L as shown in FIGS. 4 and 5. The laser beam L penetrating the protector 40b reaches a certain portion on the upper surface of the mechanical vibrating portion 33, and the surface of the portion 33 is cut by the energy of the laser beam L. In this embodiment, the laser beam L cuts a groove 39 on the upper surface of the vibrating portion 33 at the center, the groove 39 extending along the longer side of the vibrating portion 33, that is, in a direction perpendicular to the direction along which vibration is transmitted. The surface length of the portion 33 along which vibration is transmitted is increased by the depth of the groove 39. Consequently, the speed of transmission of vibration is reduced, and the vibration frequency decreases.

On the other hand, if the groove 39 extending along the longer side of the vibrating portion 33 is formed not at the center but at an end, vibration is transmitted only on the area of the mechanical vibrating portion 33 inside of the groove 39, that is, the surface length along which vibration is transmitted is reduced. Consequently, the vibration frequency increases.

Even after the piezoelectric transducer 31 is enclosed with the protectors 40a and 40b, its vibration frequency can be adjusted in this way.

Figure 6:
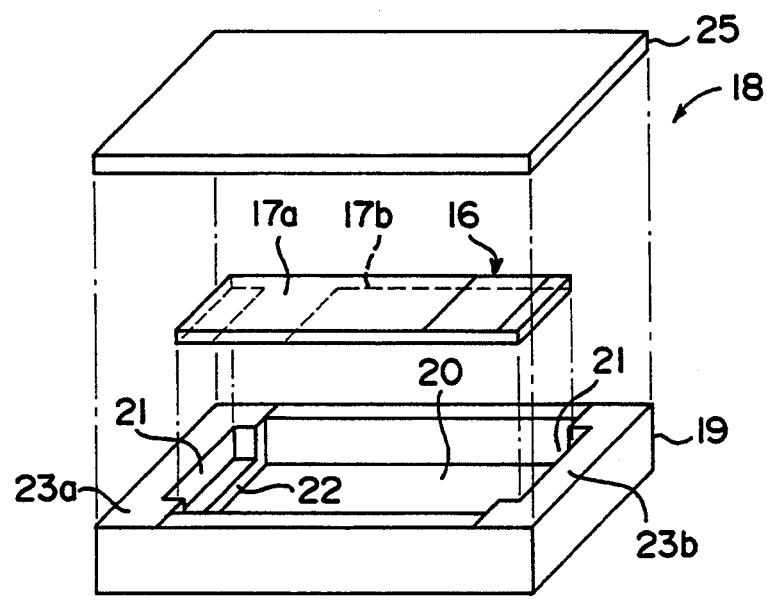
FIG. 6 is an exploded perspective view of a piezoelectric device according to a second embodiment of the present invention.
Figure 7:
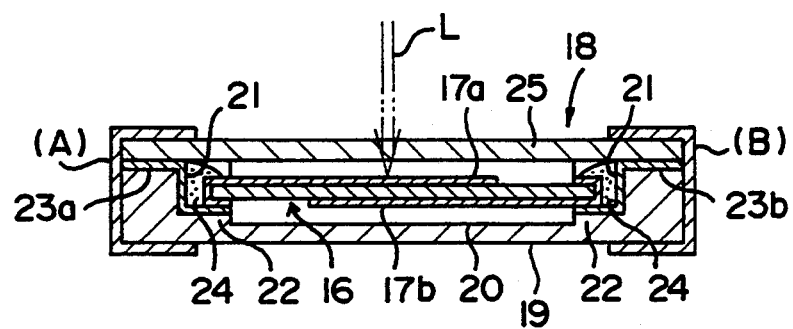
FIG. 7 is a vertical sectional view of the piezoelectric device shown in FIG. 6.

SECOND EMBODIMENT (See FIGS. 6 and 7)

FIG. 6 is an exploded perspective view of a piezoelectric device according to a second embodiment. A piezoelectric transducer 16 has vibrating electrodes 17a and 17b on its upper and lower surfaces respectively. Each of the electrodes 17a and 17b extends one of its ends to the other surface.

A protection case 18 consists of a body 19 and a lid 25 and is made of a light transmitting material, although the body 19 need not be made of a light transmitting material. The body 19 has a recess 20 with right and left walls, a notch 21 being formed on each of these two walls. The two notches 21 facilitate the setting of the piezoelectric transducer 16 into the body 19. A step 22 is formed on each of the right and left walls of the recess 20 at the bottom. The piezoelectric transducer 16 is set in the body 19 horizontally and laterally with its longer side laid between the steps 22 so that the vibrating portions of the electrodes 17a and 17b will not contact with the lid 25 or the bottom of the recess 20. Conductors 23a and 23b are formed on the upper surfaces and the notches 21 of the right and left walls by sputtering or vapor deposition. The vibrating electrodes 17a and 17b are connected with the conductors 23a and 23b respectively by solder 24.

As shown in FIG. 7, the lid 25 is joined to the body 19 by adhesive, and the piezoelectric transducer 16 is set in a vibration space shielded by the body 19 and the lid 25. Terminals (A) and (B) are formed next on the right and left sides of the piezoelectric device.

The piezoelectric device thus assembled is exposed to a laser beam L as shown in FIG. 7 in order to have its characteristics adjusted. The laser beam L, which passes through the lid 25 and reaches parts of the piezoelectric transducer 16, cuts off the vibrating electrodes 17a and 17b partly so that the resonance frequency and other characteristics of the piezoelectric device change. This adjusting process is the same as that of the first embodiment. The laser beam L changes the intensity of polarization, electromechanical coupling coefficient or dielectric constant of the piezoelectric transducer 16. Consequently, the resonance frequency and other characteristics of the piezoelectric device change.

THIRD EMBODIMENT (See FIGS. 8-11)

Figure 8:
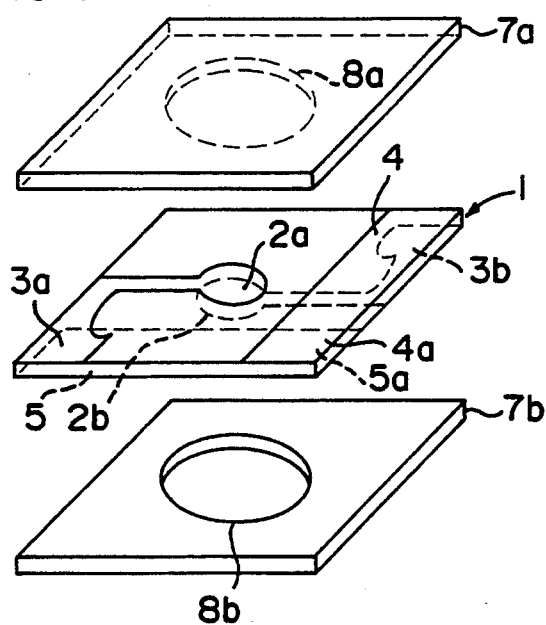
FIG. 8 is an exploded perspective view of a piezoelectric device according to a third embodiment of the present invention.

A piezoelectric device illustrated in FIG. 8 essentially consists of a piezoelectric transducer 1 and protection boards 7a and 7b. As the piezoelectric transducer 1, a ceramic plate made of polarized $Pb(ZrTi)O_3$, $pbTiO_3$, $BaTiO_3$ or the like is used. The piezoelectric transducer 1 has vibrating electrodes 2a and 2b on the upper and lower surfaces at the center respectively. The vibrating electrode 2a extends to an electrode 3a located at the front left, and the vibrating electrode 2b extends to an electrode 3b located at the rear right. The piezoelectric transducer 1 further has capacitance electrodes 4 and 5 on respectively along the right-hand side on the upper surface and along the front side on the lower surface so as to serve as a capacitor having capacitance between portions 4a and 5a where the capacitance electrodes 4 and 5 are overlapping each other.

The upper protection board 7a has a recess 8a on the lower surface at the center, and the lower protection board 7b has a recess 8b on the upper surface at the center. The protection boards 7a and 7b are made of a light transmitting material such as heat resisting glass, heat resisting acrylic or transparent ceramics.

Figure 9:
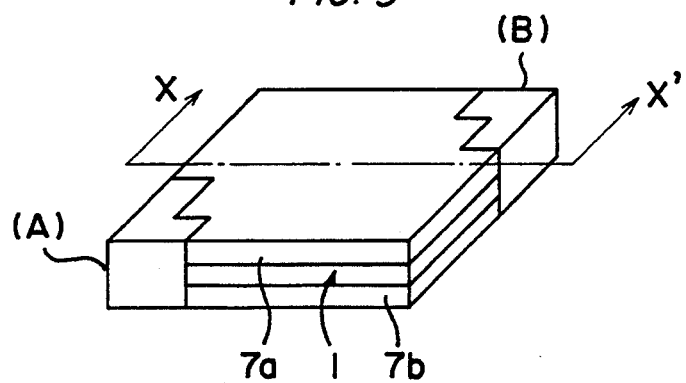
FIG. 9 is a perspective view of the piezoelectric device shown in FIG. 8 after it is assembled.
Figure 10:
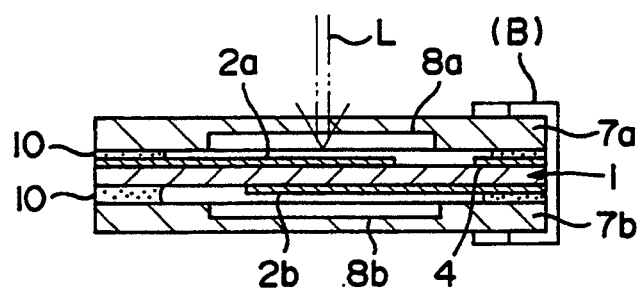
FIG. 10 is a vertical sectional view of the piezoelectric device taken along the line X—X' indicated in FIG. 9.

As shown in FIGS. 9 and 10, the protection boards 7a and 7b, and the piezoelectric transducer 1 are joined together by adhesive 10 such that a laminate having a shielded space for vibration is made. Terminals (A) and (B) are then provided in the front left and the rear right respectively.

The piezoelectric device thus assembled is subjected to a product checking process, wherein its resonance frequency, passing band width and capacitance are measured. If the results of such measurements are not within an allowable range, the product will be subjected to an adjusting process.

Figure 11:
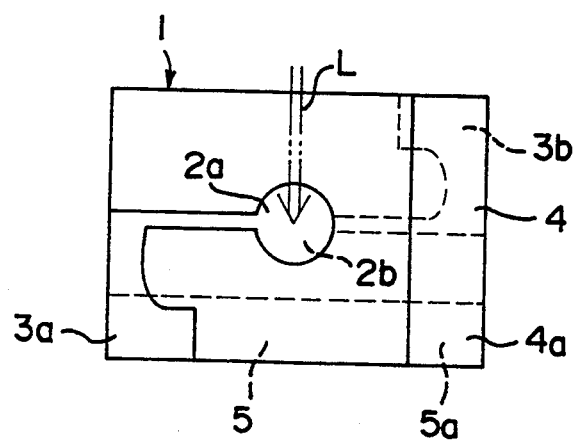
FIG. 11 is a plan view of the piezoelectric device exposed to a laser beam so that the vibration frequency, resonance characteristic, etc. can be adjusted.

Next, the adjusting process is described with reference to FIGS. 10 and 11. The piezoelectric part is exposed to a laser beam L as indicated in FIGS. 10 and 11. The laser beam L penetrating through the protection board 7a reaches parts of the piezoelectric transducer 1, thereby cutting the piezoelectric transducer 1, or changing its intensity of polarization, electromechanical coupling coefficient and dielectric constant. Accordingly, the resonance frequency and passing band width of the piezoelectric device are controlled, and the capacitance of the piezoelectric transducer 1 is trimmed.

For example, exposure of the vibrating electrode 2a to a weak laser beam increases the dielectric constant of this portion, thereby increasing the capacitance and consequently, also the resonance frequency of the piezoelectric device. If the overlapping portions 4a and 5a of the capacitance electrodes 4 and 5 are exposed to a weak laser beam, the dielectric constant therearound and capacitance therebetween are increased. Consequently, the resonance frequency of the piezoelectric device decreases. If the vibrating electrode 2a is exposed to a strong laser beam, the vibrating electrode 2a is heated, and the intensity of polarization and capacitance therearound are reduced. Consequently, the resonance frequency of the piezoelectric device decreases. If the vibrating electrodes 2a and 2b are exposed to a comparatively strong laser beam, the vibrating electrodes 2a and 2b are cut off partly, the capacitance therebetween being reduced. Consequently, tile resonance frequency of the piezoelectric device decreases. If the overlapping portions 4a and 5a of the capacitance electrodes 4 and 5 are exposed to a comparatively strong laser beam, the portions 4a and 5a are cut off partly, the capacitance therebetween being reduced. Consequently, the resonance frequency of the piezoelectric device increases. In case where resist ink for adjusting the resonance frequency is laid on the vibrating electrodes 2a and 2b, exposure of the resist ink to a comparatively strong laser beam thins the resist ink, consequently increasing the resonance frequency of the piezoelectric device. Exposure of the vibrating electrodes 2a and 2b to a comparatively strong laser beam thins the electrodes 2a and 2b, consequently increasing the resonance frequency of the piezoelectric device. On the other hand, exposure of the piezoelectric device to a laser beam decreases the electromechanical coupling coefficient (kt) of the piezoelectric transducer, which is usually about 0.40 if the transducer is made of $PbTiO_3$ and about 0.45 if the transducer is made of $Pb(ZrTi)O_3$.

The passing band width of the piezoelectric device can thus be controlled.

In this way, the resonance frequency, capacitance, etc. of the finished piezoelectric device can be adjusted so as to be within an allowable range.

Figure 12:
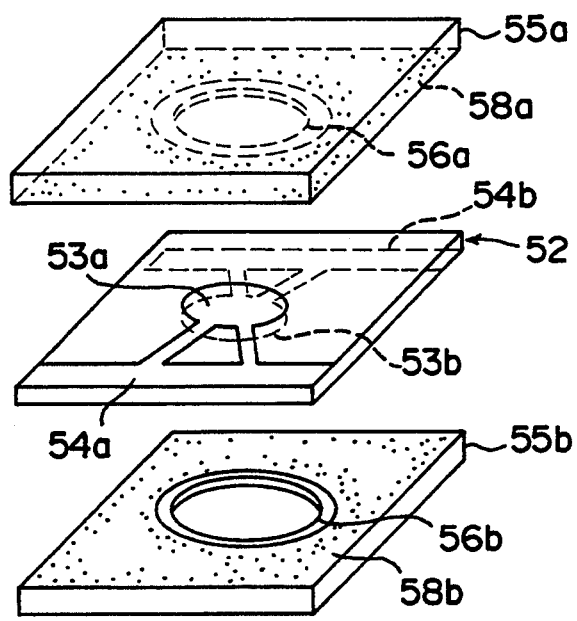
FIG. 12 is an exploded perspective view of a piezoelectric device according to a fourth embodiment of the present invention.
Figure 13:
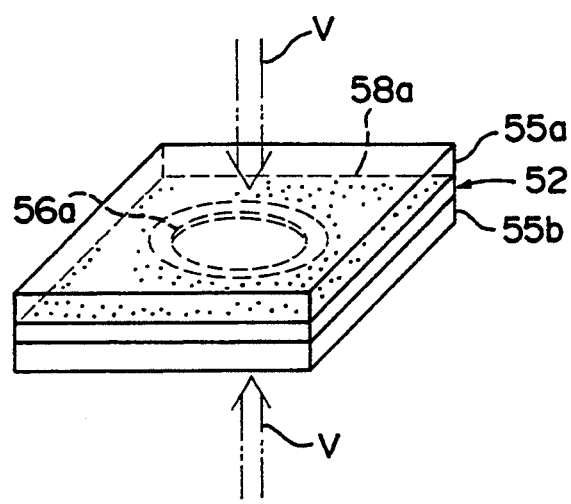
FIG. 13 is a perspective view of the piezoelectric device shown in FIG. 12 after it is assembled into a laminate.

FOURTH EMBODIMENT (See FIGS. 12 and 13)

FIG. 12 is an exploded perspective view of a piezoelectric device according to a fourth embodiment. A piezoelectric transducer 52 has vibrating electrodes 53a and 53b on the upper and lower surfaces respectively, at the center. The vibrating electrode 53a extends to an electrode 54a formed along the front side (with reference to FIG. 12) of the piezoelectric transducer 52, and the vibrating electrode 53b extends to an electrode 54b formed along the rear side.

An upper protection board 55a has a recess 56a on the lower surface at the center, and a lower protection board 55b has a recess 56b on the upper surface at the center. This arrangement is to form a space for vibrations of the vibrating electrodes 53a and 53b. The protection boards 55a and 55b are made of an ultraviolet-ray transmitting material such as heat resisting glass or ultraviolet-ray transmitting type acrylic resin. The lower surface of the upper protection board 55a and the upper surface of the lower protection board 55b are coated with an ultraviolet-ray setting agent 58a 58b except for the recesses 56a and 56b, and peripheral areas thereof.

As shown in FIG. 13, the piezoelectric transducer 52 and the protection boards 55a and 55b are laminated so that the piezoelectric transducer 52 is placed between the protection boards 55a and 55b. The piezoelectric transducer 52 is enclosed with the ultraviolet-ray setting agent 58a and 58b, and ultraviolet rays V irradiate the laminated piezoelectric device from both above and below. The ultraviolet rays V penetrate the protection boards 55a and 55b and harden the ultraviolet-ray setting agent 58a and 58b. Since it is not thermosetting resin but ultraviolet-ray setting agent that is used in this embodiment, the piezoelectric device is not heated so much while the agent is hardened as in the case of using a thermosetting resin. Accordingly, it is less likely that the electrical characteristic of the polarized piezoelectric transducer 52 be deteriorated by heat. In this way, the protection boards 55a and 55b, and the piezoelectric transducer 52 are joined into a laminate by the ultraviolet-ray setting agent 58a and 58b. The piezoelectric device is subsequently completed with terminals provided on the right and left sides.

Figure 14:
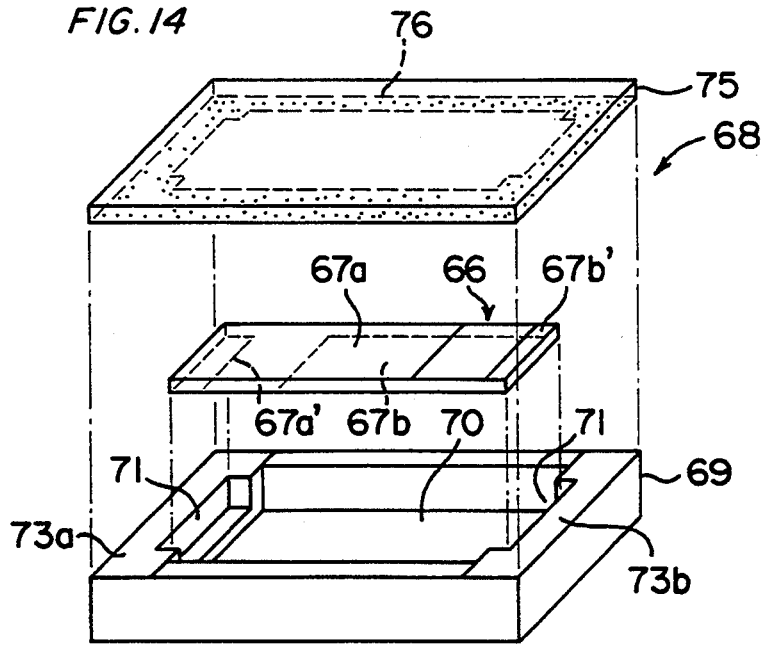
FIG. 14 is an exploded perspective view of a piezoelectric device according to a fifth embodiment of the present invention.
Figure 15:
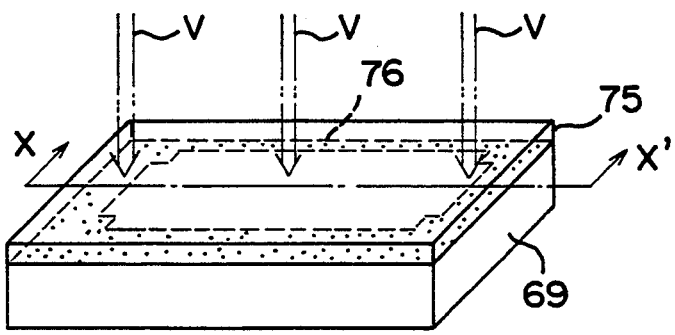
FIG. 15 is a perspective view of the piezoelectric device shown in FIG. 14 after it is assembled.
Figure 16:
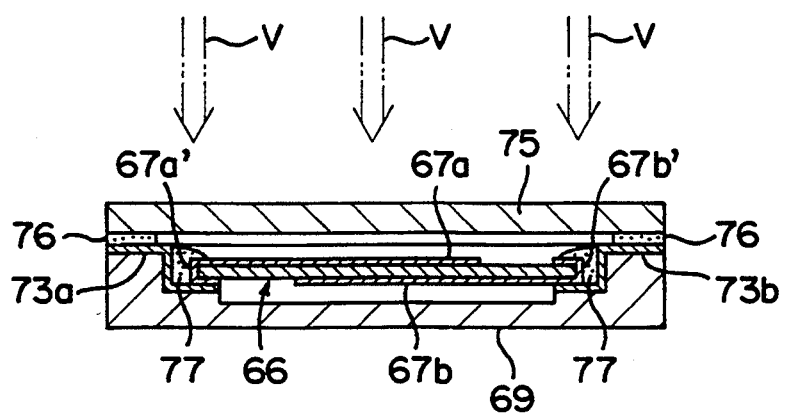
FIG. 16 is a vertical sectional view of the piezoelectric device taken along the line X—X' indicated in FIG. 15.

FIFTH EMBODIMENT (See FIGS. 14-16)

FIG. 14 is an exploded perspective view of a piezoelectric device according to a fifth embodiment. A piezoelectric transducer 66 has vibrating electrodes 67a and 67b on the upper and lower surfaces respectively. The vibrating electrodes 67a and 67b extend respectively to extension electrodes 67a' and 67b' which cover the mutually opposite side edges of the transducer 66 and each extended to the opposite surface.

A protection case 68 consists of a body 69 and a lid 75, and is made of an ultraviolet-ray transmitting material, although the body 69 need not be made of an ultraviolet-ray transmitting material. The body 69 has a recess 70, and a notch 71 is formed on its right and left walls. Guided by the notches 71, the piezoelectric transducer 66 is placed in the body 69 horizontally and laterally. Conductors 73a and 73b are formed on the upper surfaces of the right and left walls of the recess 70 and on the notches 71. The piezoelectric transducer 66 is set in the body 69 so that the extension electrodes 67a' and 67b' contact with the conductors 73a and 73b respectively. The respective contact portions between the extension electrodes 67a' and 67b' and the conductors 73a and 73b are coated with a conductive ultraviolet-ray setting agent 77 (see FIG. 16). The conductive ultraviolet-ray setting agent 77 may be, for example, conductive paste which is a compound of an ultraviolet-ray setting agent and a conductive filler such as silver. The backside of the lid 75 is coated with an ultraviolet-ray setting agent 76 except for an area facing the recess 70 of the body 69.

The lid 75 is put on the body 69 with the coated side facing downward, and ultraviolet rays V irradiate the case 68 housing the piezoelectric transducer 66 from above as shown in FIGS. 15 and 16. The ultraviolet rays V penetrate the lid 75 and harden the ultraviolet-ray setting agent 76 which coats the backside of the lid 75. The ultraviolet rays V also harden the conductive ultraviolet-ray setting agent 77 on the contact portions between the extension electrodes 67a' and 67b' and the conductors 73a and 73b. Thus, the lid 75 is joined to the body 69 by the ultraviolet-ray setting agent 76, and the extension electrodes 67a' and 67b' are joined to the conductors 73a and 73b respectively by the conductive ultraviolet-ray setting agent 77. In this manner, the piezoelectric transducer 66 is shielded in the protection case 68 having a space for vibration therein. In this way, a piezoelectric device is assembled without deteriorating the electrical characteristic of the polarized piezoelectric transducer 66.

Although the ultraviolet-ray setting agent is used for both joining the lid 75 to the body 69 and joining the extension electrodes 67a' and 67b' to the conductors 73a and 73b in this embodiment, it is possible to use the ultraviolet-ray setting agent for only one of the joining processes. For example, the ultraviolet-ray setting agent can be used only for joining the lid 75 to the body 69, and the extension electrodes 67a' and 67b' can be joined to the conductors 73a and 73b by solder.

The piezoelectric device is thereafter completed by providing terminals on the right and left sides. If transparent acrylic resin or glass is used for the lid 75, users can see inside the protection case 68 and visually check the setting of the piezoelectric transducer 66 in the case 68.

OTHER EMBODIMENTS

Although the present invention has been described in connection with only a few preferred embodiments above, it is to be noted that various changes and modifications are possible to those who are skilled in the art. Such changes and modifications are to be understood as included within the scope of the invention.

For example, the vibration mode of a piezoelectric transducer is not limited to the thickness mode and the stretch mode, and the piezoelectric transducer can be so made that it vibrates in another vibration mode such as a shear mode.

What is claimed is:

1. A method of producing a piezoelectric device, said method comprising the steps of:
   mounting a piezoelectric transducer inside a housing structure which has a light-transmitting region;
   selecting a cut-forming region on said transducer, depending upon whether the vibration frequency of said transducer is to be increased or decreased;
   causing a laser beam to pass through said light-transmitting region of said housing structure and exposing said cut-forming region to said laser beam; and
   thereby forming a groove in said cut-forming region on said transducer such that the surface length of the portion of said transducer along which vibration can be transmitted is selectively decreased or increased and hence that the vibration frequency of said transducer is correspondingly increased or decreased.

2. The method of claim 1 wherein said transducer is planar and has mutually opposite surfaces with a pair of vibrating electrodes thereon, and said laser beam is caused to partially cut said vibrating electrodes, said method further comprising the steps of:
   providing peripheral electrodes each abutting an edge of said transducer;
   providing conductive ultraviolet-ray setting agent between said peripheral electrodes and said vibrating electrodes; and
   exposing said conductive ultraviolet-ray setting agent to ultraviolet radiation.

3. The method of claim 1 wherein said piezoelectric transducer comprises a vibrating elastic plate having mutually opposite first and second surfaces, a piezoelectric layer being formed on said first surface, and said laser beam makes said groove on said second surface.

4. The method of claim 3 wherein said vibrating elastic plate is generally rectangular, having a longer side and a shorter side which are substantially perpendicular to each other, said groove being made parallel to said longer side selectively either near the center of said plate so as to increase said surface length with the depth of said groove or on an edge so as to decrease said surface length by the width of said groove, depending on whether the vibration frequency of said transducer is to be increased or decreased.

5. The method of claim 1 further comprising the steps of
providing an ultraviolet-ray setting agent between said piezoelectric transducer and said housing structure, and
exposing said ultraviolet-ray setting agent to ultraviolet radiation through said housing structure so as to harden said ultraviolet-ray setting agent and to thereby form a laminate of said piezoelectric transducer and said housing structure.

6. A method of producing a piezoelectric device, said method comprising the steps of:
mounting a planar piezoelectric transducer inside a housing structure which has a light-transmitting region, said transducer having mutually opposite surfaces, a pair of capacitance-providing electrodes being on said mutually opposite surfaces and having a mutually overlapping area;
causing a laser beam to pass through said light-transmitting region of said housing structure and thereby partially cutting said capacitance-providing electrodes to reduce the capacitance thereof, wherein the resonance frequency of said piezoelectric device is increased.

7. The method of claim 6 wherein said transducer is planar and has mutually opposite surfaces with a pair of vibrating electrodes thereon, and said laser beam is caused to partially cut said vibrating electrodes, said method further comprising the steps of:
providing peripheral electrodes each abutting an edge of said transducer;
providing conductive ultraviolet-ray setting agent between said peripheral electrodes and said vibrating electrodes; and
exposing said conductive ultraviolet-ray setting agent to ultraviolet radiation.

8. The method of claim 6 wherein said piezoelectric transducer comprises a vibrating elastic plate having mutually opposite first and second surfaces, a piezoelectric layer being formed on said first surface, and said laser beam makes a cut on said second surface.

9. The method of claim 8 wherein said vibrating elastic plate is generally rectangular, having a longer side and a shorter side which are substantially perpendicular to each other, said cut being made to form a groove parallel to said longer side selectively either near the center of said plate or near an edge, depending on whether the vibration frequency of said transducer is to be increased or decreased.

10. The method of claim 6 further comprising the steps of
providing an ultraviolet-ray setting agent between said piezoelectric transducer and said housing structure, and
exposing said ultraviolet-ray setting agent to ultraviolet radiation through said housing structure so as to harden said ultraviolet-ray setting agent and to thereby form a laminate of said piezoelectric transducer and said housing structure.

11. A method of producing a piezoelectric device, said method comprising the steps of:
mounting a planar piezoelectric transducer inside a housing structure which has a light-transmitting region, said transducer having mutually opposite surfaces, a pair of capacitance-providing electrodes being on said mutually opposite surfaces and having a mutually overlapping area;
causing a relatively weak laser beam to pass through said light-transmitting region of said housing structure and exposing said mutually overlapping area of said transducer between said pair of capacitance-providing electrodes to thereby increase the dielectric constant of said transducer between said pair of capacitance-providing electrodes, wherein the capacitance of said capacitance-providing electrodes is increased.

12. The method of claim 11 wherein said piezoelectric transducer comprises a vibrating elastic plate having mutually opposite first and second surfaces, a piezoelectric layer being formed on said first surface, and said laser beam makes a cut on said second surface.

13. The method of claim 12 wherein said vibrating elastic plate is generally rectangular, having a longer side and a shorter side which are substantially perpendicular to each other, said cut being made to form a groove parallel to said longer side selectively either near the center of said plate to thereby increase the surface length of the portion of said transducer along which vibration can be transmitted or on an edge to thereby decrease said surface length, depending on whether the vibration frequency of said transducer is to be decreased or increased, respectively.

14. The method of claim 13 further comprising the steps of:
providing an ultraviolet-ray setting agent between said piezoelectric transducer and said housing structure, and exposing said ultraviolet-ray setting agent to ultraviolet radiation through said housing structure so as to harden said ultraviolet-ray setting agent and to thereby form a laminate of said piezoelectric transducer and said housing structure.

15. The method of claim 13 wherein said transducer is planar and has mutually opposite surfaces with a pair of vibrating electrodes thereon, and said laser beam is caused to partially cut said vibrating electrodes, said method further comprising the steps of:
providing peripheral electrodes each abutting an edge of said transducer;
providing conductive ultraviolet-ray setting agent between said peripheral electrodes and said vibrating electrodes; and
exposing said conductive ultraviolet-ray setting agent to ultraviolet radiation.

16. The method of claim 11 further comprising the steps of:
providing an ultraviolet-ray setting agent between said piezoelectric transducer and said housing structure, and exposing said ultraviolet-ray setting agent to ultraviolet radiation through said housing structure so as to harden said ultraviolet-ray setting agent and to thereby form a laminate of said piezoelectric transducer and said housing structure.

17. The method of claim 11 wherein said transducer is planar and has mutually opposite surfaces with a pair of vibrating electrodes thereon, and said laser beam is caused to partially cut said vibrating electrodes, said method further comprising the steps of:
  providing peripheral electrodes each abutting an edge of said transducer;
  providing conductive ultraviolet-ray setting agent between said peripheral electrodes and said vibrating electrodes; and
  exposing said conductive ultraviolet-ray setting agent to ultraviolet radiation.

* * * * *